United States Patent [19]
Obregón et al.

[11] Patent Number: 5,432,462
[45] Date of Patent: Jul. 11, 1995

[54] INPUT BUFFER CIRCUIT HAVING SLEEP MODE AND BUS HOLD FUNCTION

[75] Inventors: Carlos D. Obregón, Phoenix; Michael A. Wells, Chandler; Eric D. Neely, Mesa, all of Ariz.

[73] Assignee: Motorola, Inc., Schaumburg, Ill.

[21] Appl. No.: 54,495

[22] Filed: Apr. 30, 1993

[51] Int. Cl.⁶ .................. H03K 19/08; H03K 19/0175
[52] U.S. Cl. ........................................ 326/21; 326/85; 326/65; 326/110; 327/525
[58] Field of Search ............... 307/443, 451, 446, 475, 307/296.3; 326/84–85, 110, 21, 65, 81, 121; 327/525

[56] References Cited

U.S. PATENT DOCUMENTS

| | | | |
|---|---|---|---|
| 4,707,623 | 11/1987 | Bismarck | 307/443 |
| 4,717,847 | 1/1988 | Nolan | 307/475 |
| 4,804,868 | 2/1989 | Masuda et al. | 307/446 |
| 4,894,558 | 1/1990 | Conkle et al. | 307/296.3 |
| 5,083,048 | 1/1992 | Kashimura | 307/446 |
| 5,087,841 | 2/1992 | Rogers | 307/443 |
| 5,138,194 | 8/1992 | Yoeli | 307/443 |
| 5,146,111 | 9/1992 | Ciraula et al. | 307/443 |
| 5,146,118 | 9/1992 | Nakamura et al. | 307/475 |
| 5,276,362 | 1/1994 | Obregon et al. | 326/65 |
| 5,280,203 | 1/1994 | Hung et al. | 307/272.2 |

Primary Examiner—David R. Hudspeth
Assistant Examiner—Jon Santamauro
Attorney, Agent, or Firm—Rennie William Dover

[57] ABSTRACT

The present invention includes an input buffer circuit (10) having sleep mode and bus hold capability. An input section (11) of the buffer circuit is operated from an operating voltage which is lower than a supply voltage of the buffer circuit thereby minimizing the static power dissipation. Sleep mode circuitry (15, 36, 38) is included for effectively disconnecting an input signal from the rest of the buffer circuit thereby minimizing dynamic power dissipation. Bus hold circuitry (40) is included for holding the logic state appearing at an output of the input buffer circuit when the input signal is removed thereby further reducing the static power dissipation.

11 Claims, 2 Drawing Sheets

INPUT BUFFER CIRCUIT HAVING SLEEP MODE AND BUS HOLD FUNCTION

BACKGROUND OF THE INVENTION

The present invention relates, in general, to electrical circuits, and more particularly, to a novel input buffer having sleep mode and bus hold for providing low static and dynamic power dissipation.

In the past, a variety of circuit configurations have been utilized to provide complementary metal oxide semiconductor (CMOS) circuits which are capable of accepting transistor-transistor logic (TTL) voltage levels. The semiconductor industry has also combined CMOS with bipolar to form BICMOS circuits having TTL compatible inputs. One notable disadvantage of most, if not all, such prior circuits is the amount of power dissipated by the circuits input stage. The voltage value of a TTL signal generally varies over a large range, and often drops to a level that is insufficient to disable the prior circuits input transistors. When this occurs, excessive power is dissipated in the form of leakage current flowing through these input transistors.

There have been attempts to minimize the static power dissipation of an input stage. For example, a circuit for lowering the operating potential of the input transistors of the circuit and then restoring the voltage level at the output of the circuit is fully described in U.S. patent application having U.S. Pat. No. 5,276,362 and issue date of Jan. 4, 1994. Although the circuit minimizes static power dissipation, it does not, however, minimize the dynamic power dissipation nor does it provide a sleep mode or a bus hold function;

Accordingly, it is desirable to provide a circuit that has an input which operates with a TTL input signal, that has low static and dynamic power dissipation, and that has the capability of operating in a sleep mode and a bus hold function.

DETAILED DESCRIPTION OF THE DRAWINGS

Figure 1:
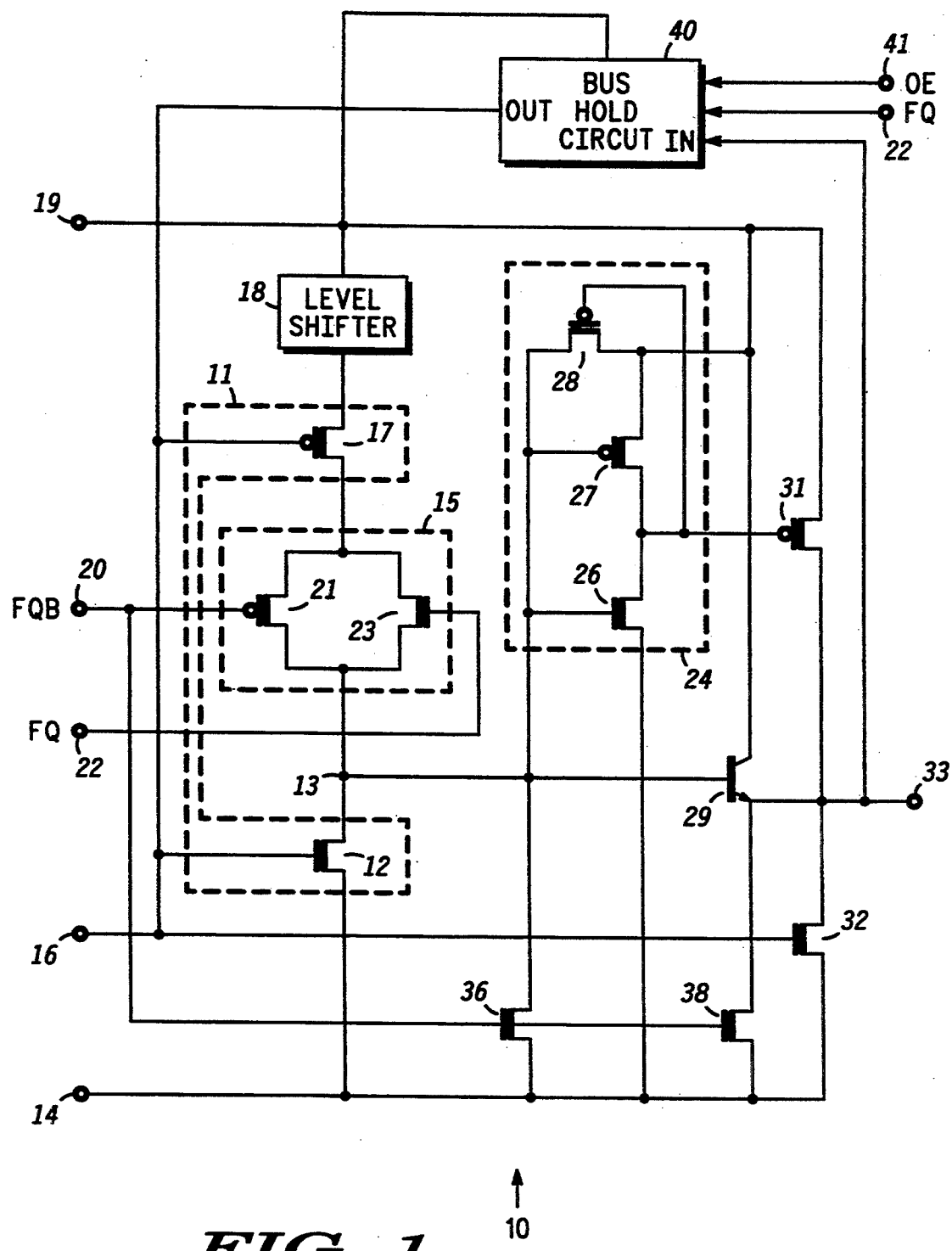
FIG. 1 is a detailed schematic/block diagram illustrating an embodiment of an input buffer circuit having sleep mode and bus hold circuitry in accordance with the present invention.

Referring to FIG. 1, there is illustrated input buffer circuit 10 having sleep mode and bus hold circuitry incorporated therein. Circuit 10 provides translation of a TTL level signal appearing at terminal 16 to a CMOS level signal at an output 33 of circuit 10. Also included in circuit 10 is an input circuit 11 and a level shifter 18 wherein level shifter 18 may be, for example, a schottky diode. It is worth noting that circuit 10 may be utilized to accept input signals other than TTL by the modification or deletion of level shifter 18.

Input circuit 11 has a pair of complementary metal oxide semiconductor (CMOS) transistors 12 and 17 having their drain electrodes coupled together via transmission gate 15 wherein transistors 12 and 17 function as an inverter when transmission gate 15 is in a conductive state. In particular, the TTL signal is applied to transistors 12 and 17 through a connection between an input 16 of circuit 10 and a gate of each transistor 12 and 17. Transistor 12 also has a source connected to a voltage return terminal or voltage return 14, and a drain connected to both a pull-up node 13 and to transmission gate 15. A source of transistor 17 is connected to an output of a shifter means or level shifter 18 in order to provide an operating voltage to input circuit 11. A drain of transistor 17 is coupled to transmission gate 15.

Shifter 18 derives the operating voltage through a connection between an input of shifter 18 and a voltage supply terminal of circuit 10 or voltage supply 19.

Transmission gate 15 includes transistors 21 and 23 having gate electrodes respectively coupled to terminals 20 and 22 at which control signals FQB and FQ are applied. The source of transistor 21 and the drain of transistor 23 are both coupled to the drain of transistor 17. Similarly, the source of transistor 23 and the drain of transistor 21 are both coupled to the drain of transistor 12. It is understood that when control signal FQ is in a logic high state and control signal FQB is in a logic low state, transmission gate 15 is rendered operative and essentially couples the drain of transistor 17 to the drain of transistor 12. Further, the following discussion assumes that transmission gate 15 is rendered operative.

In order to obtain low static power dissipation in input circuit 11, it is important that transistor 17 remain disabled when a high level TTL signal is applied to input 16. Since the high level TTL signal may have a voltage as low as 2.4 volts, transistor 17 must remain disabled at such an applied voltage. It has been found that in order to completely disable transistor 17 the threshold voltage of transistor 17 must be greater than the high level TTL signal's voltage minus the operating voltage. This condition provides circuit 11 with a high level or upper level threshold voltage that minimizes static power dissipation. If the operating voltage is too large, transistor 17 is slightly enabled and provides a leakage current path that increases static power dissipation. Level shifter 18 provides such an operating voltage to circuit 11. A desired operating voltage is obtained by dropping a portion of the voltage from supply 19 across level shifter 18 in order to provide a predetermined voltage drop and, thus, provide a lower operating voltage for input circuit 11.

As a result of this lower operating voltage being applied to input circuit 11, when a high level TTL signal is applied to input 16, transistor 17 is completely disabled thereby substantially eliminating the flow of leakage current through transistor 17. Consequently, static power dissipation in circuit 11 is minimized.

When a low level TTL signal is applied to input 16, transistor 12 is disabled and transistor 17 is enabled thereby coupling the operating voltage to node 13. Since the value of the operating voltage is lower than the normal voltage value of a high level signal within circuit 10, hereinafter referred to as a high, a restore means or restore circuit 24 is provided to function as a means for restoring the voltage level of node 13 to the voltage of a normal high. In addition, restore circuit 24 also has an output that is used to enable an upper output transistor 31. Restore circuit 24 can have a variety of configurations that responds to a reduced high level voltage applied to node 13 and subsequently increases the voltage applied to node 13 to the voltage of a high.

In the preferred embodiment, restore circuit 24 includes a feedback transistor 28 and inverter connected transistors 26 and 27. Pull-up node 13 is connected to a drain of transistor 28 and to a gate of each transistor 26 and 27. Also, transistor 26 has a source connected to return 14, and a drain connected to the output of circuit 24 and to the gate of transistor 28. Transistor 27 has a drain connected to the drain of transistor 26, and a source that is connected to both supply 19 and a source of transistor 28. When transistor 17 applies the operating voltage, minus the voltage drop of transistor 17, to node 13, transistor 26 is enabled and couples the gate of transistor 28 to return 14 thereby enabling transistor 28 and coupling supply 19 to node 13. To ensure transistor 17 enables transistor 26, transistors 26 and 27 are formed with a channel width ratio that provides transistor 26 with sufficient gain to pull the output of circuit 24 low at the reduced voltage value supplied by transistor 17. In this preferred embodiment, transistors 27 and 26 have a channel width ratio of 1:4.

Once transistor 28 is enabled, circuit 24 forms a latch that keeps transistor 28 enabled. To ensure that transistor 28 can be disabled, transistor 28 is formed so that transistor 12 can pull node 13 low even while transistor 28 is enabled. Consequently, when transistor 12 applies a low to node 13, transistor 26 is disabled while transistor 27 is enabled, thus, disabling transistor 28.

In addition to the connection between the output of circuit 24 and the gate of transistor 31, transistor 31 also has a source connected to supply 19, and a drain connected to an output terminal of circuit 10 or output 33.

A lower output transistor 32 has a source connected to return 14 and a drain connected to output 33. To provide a rapid high-to-low transition on output 33, transistor 32 has a gate connected to input 16 thereby bypassing the internal delay stages of circuit 10. Circuit 10 provides high drive current during low-to-high transitions on output 33 with a bipolar current source transistor 29. Transistor 29 has an emitter connected to output 33, a collector connected to supply 19, and a base connected to node 13. When a low level TTL signal is applied to input 16, transistor 17 applies the operating voltage to node 13 thereby enabling transistor 29 while the output of circuit 24 enables transistor 31. Once transistors 29 and 31 are enabled, the voltage on output 33 increases until the voltage reaches a predetermined value that disables transistor 29. In the preferred embodiment, the predetermined value is approximately the voltage applied to supply 19 minus the base-emitter voltage ($V_{BE}$) of transistor 29. After transistor 29 is disabled, transistor 31 remains enabled. Consequently, transistor 29 provides high current drive during the low-to-high transition of output 33, but is subsequently disabled thereby dissipating no static power. This low power, high current function provides a significant advantage over prior circuits.

Further, transistors 29 and 31 provide temperature compensation for each other wherein as the transconductance of one increases, the transconductance of the other decreases. For example, at elevated temperatures, the transconductance of transistor 29 increases but the transconductance of transistor 31 decreases. Therefore, the amount of current applied to output 33 during a low-to-high transition remains substantially constant over temperature.

When it is desired to enter the sleep mode, transmission gate 15 is rendered non-operative via control signals FQ and FQB wherein control signal FQ is switched to a logic low state thereby disabling transistor 23 and FQB is switched to a logic high state thereby disabling transistor 21. As a result, there will be substantially zero dynamic power dissipation since transistor 17 is now completely disconnected from transistors 12 and 29 and restore circuit 24 since transmission gate 15 is disabled. Moreover, since control signal FQB is in a logic high state during the sleep mode, transistors 36 and 38 are rendered operative wherein the voltage appearing at output terminal 33 will be held to a logic low voltage via transistor 38. In particular, transistor 36 has a drain coupled to the base of transistor 29 while transistor 38 has a drain coupled to the emitter of transistor 29. Further, the sources of transistors 36 and 38 are coupled to return terminal 14. Also, the gates of transistors 36 and 38 are coupled to terminal 20 to receive signal FQB. Thus, this sleep mode feature allows an input signal appearing at terminal 16 to remain switching without causing any dynamic power dissipation in circuit 10 since the input signal is effectively disconnected from pull-up node 13 as well as the rest of circuit 10 by disabling transmission gate 15. Further, it is understood that signals FQ and FQB can be generated from an external pin, from a power on reset signal, or from complementary output enable signals.

In summary, input buffer circuit 10 includes a sleep mode function which is comprised of transmission gate 15 and transistors 36 and 38 which are responsive to control signals FQ and FQB for disabling the input signal appearing at terminal 16 from pull-up node 13 as well as the rest of circuit 10.

Input buffer circuit 10 also includes bus hold circuit 40 for providing a bus hold function that is compatible with the above described sleep mode function. Bus hold circuit 40 is responsive to control signals FQ and OE (an output enable signal) and is coupled to power terminal 19. Bus hold circuit 40 has an input coupled to output terminal 33 for providing an output at input terminal 16.

Briefly, bus hold circuit 40, when enabled via signals FQ and OE, functions to hold the logic state appearing at terminal 16, for example, when the input signal applied at terminal 16 is removed. This is accomplished by utilizing bus hold circuit 40 to supply the inversion of the logic state appearing at output terminal 33 to input terminal 16 wherein circuit 10 subsequently provides an additional inversion from terminal 16 to terminal 33 via input circuit 11. Thus, bus hold circuit 40 functions to hold the logic state appearing at terminal 16 when the input signal appearing at terminal 16 is removed. This prevents the voltage appearing at terminal 16 from drifting and causing static power dissipation. Further, it is understood that control signal FQ or OE can be utilized to disable bus hold circuit 40.

Figure 2:
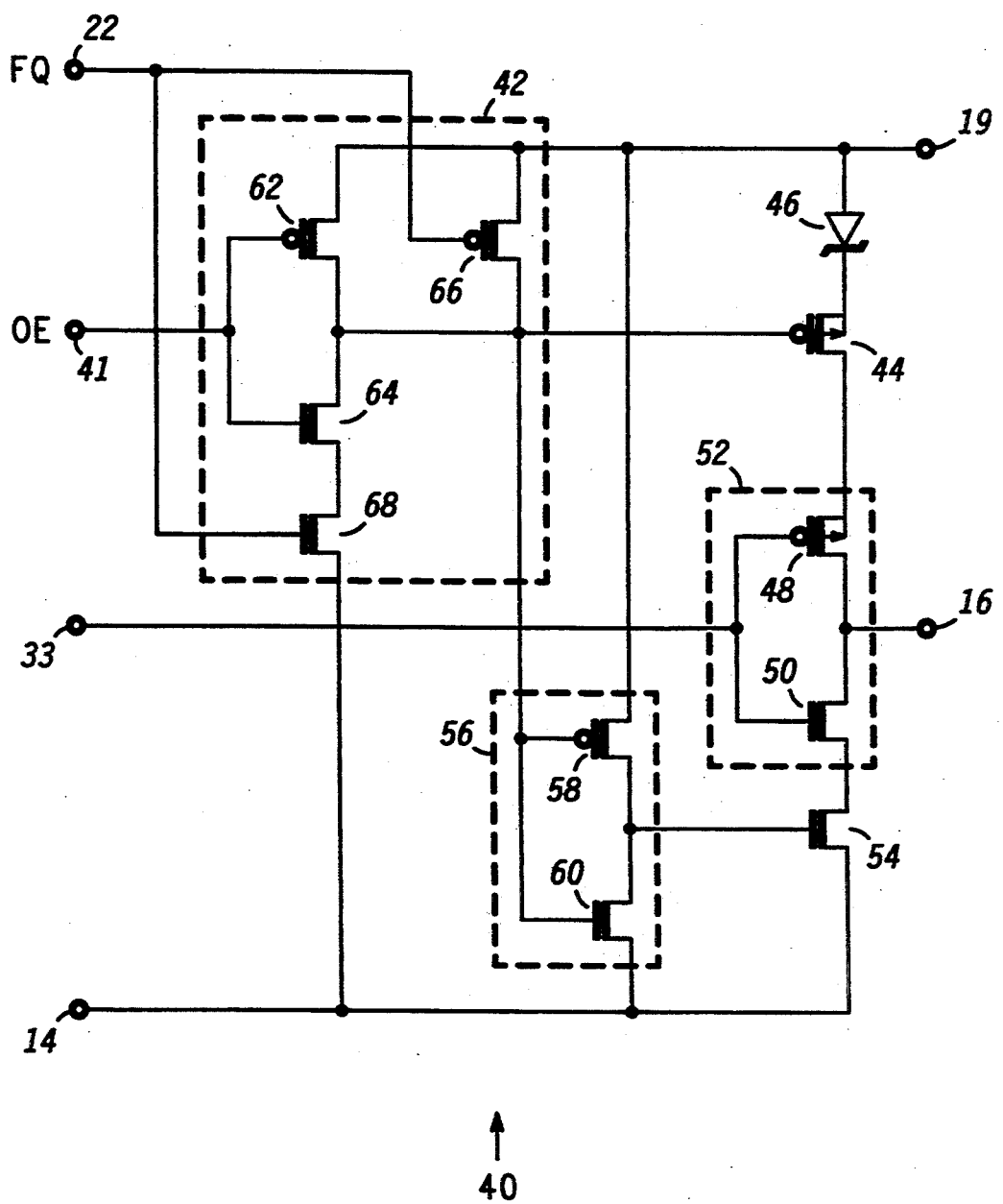
FIG. 2 is a more detailed schematic diagram illustrating an embodiment of the bus hold circuitry in accordance with the present invention.

Referring to FIG. 2, a more detailed schematic diagram illustrating an embodiment of bus hold circuit 40 is shown. It is understood that components shown in FIG. 2 which are identical to components shown in FIG. 1 are identified by the same reference numbers.

Bus hold circuit 40 includes NAND gate 42 having a first input coupled to terminal 22 for receiving control signal FQ, and a second input coupled to terminal 41 for receiving signal OE. An output of NAND gate 42 is coupled to a gate electrode of output transistor 44. The source electrode of transistor 44 is coupled through schottky diode 46 to terminal 19. The drain electrode of transistor 44 is coupled to the source electrode of transistor 48 the latter of which has a drain electrode coupled to the drain electrode of transistor 50 and to terminal 16.

The gate electrodes of transistors 48 and 50, which represent the input of inverter 52 as well as the input of bus hold circuit 40, are coupled to terminal 33. Likewise, the common drains of transistors 48 and 50 are coupled together and represent the output of bus hold circuit 40 as well as the output of inverter 52. In addition, the source electrode of transistor 50 is coupled to the drain electrode of transistor 54, the latter of which has a source electrode coupled to terminal 14.

The output of NAND gate 42 is coupled to an input of inverter 56 which has an output coupled to the gate electrode of transistor 54.

Inverter 56 includes transistors 58 and 60 each having a common gate electrode coupled to the output of NAND gate 42 and a common drain electrode coupled to the gate electrode of transistor 54. The source electrode of transistor 58 is coupled to terminal 19 while the source electrode of transistor 60 is coupled to terminal 14.

NAND gate 42 includes transistor 62 having a gate electrode coupled to terminal 41 and to the gate electrode of transistor 64. The drain electrodes of transistors 62, 64 and 66 are all coupled to the output of NAND gate 42. The source electrodes of transistor 62 and 66 are coupled to terminal 19 while the gate electrode of transistor 66 is coupled to terminal 22. The source electrode of transistor 64 is coupled to the drain electrode of transistor 68 the latter having a source electrode coupled to terminal 14. The gate electrode of transistor 68 is coupled to terminal 22.

The substrates of transistors 44 and 48 are coupled through schottky diode 46 to terminal 19 thereby reducing the loading caused by parasitic diodes occurring within transistor 48 when the difference between the voltage appearing at terminal 16 and the voltage appearing at terminal 19 ($V_{16}-V_{19}$) is greater than a base-emitter voltage ($V_{BE}$).

In operation, if the output of NAND gate 42 is a logic low, then bus hold circuit 40 is rendered operative. In particular, output transistors 44 and 54 are rendered operative and the logic signal appearing at terminal 33 is inverted via inverter 52 and supplied to terminal 16. Control signals FQ and OE determine whether bus hold circuit 40 is operative such that if both signals FQ and OE are in a logic high state, then the output of NAND circuit 42 is a logic low thereby enabling transistors 44 and 54 (via inverter 56) which in turn enable transistors 48 and 50.

However, if control signal FQ or control signal OE or both are in a logic low state, then the output of NAND gate 42 is a logic high which functions to render output transistors 44 and 54 non-operative thereby disabling bus hold circuit 40. In this manner, it is said that bus hold circuit 40 is compatible with the aforedescribed sleep mode function.

Transistors 44, 48, 50 and 54 are designed to be weak channel transistors such that bus hold circuit 40 will yield preference to other drivers. In other words, bus hold circuit 40 will yield the bus to any device that has a higher source or sink current than provided by bus hold circuit 40.

In summary, bus hold circuit 40 includes control circuitry (NAND gate 42 and transistors 44 and 54 and inverter 56) which is responsive to control signals FQ and OE for enabling inverter 52 and thereby enabling bus hold circuit 40.

As a simple example to illustrate the operation of bus hold circuit 40, suppose that the signal appearing at terminal 16 is in a logic high state, which results in a logic low state appearing at terminal 33, is removed. This logic low state appearing at terminal 33 renders transistor 48 operative and assuming that bus hold circuit 40 is rendered operative via signals FQ and OE, transistor 44 is also turned on. As a result, when the signal appearing at terminal 16 is removed, transistors 44 and 48 function to slowly pull the bus back to a logic high state.

By now it should be appreciated that there has been provided a novel input buffer circuit that has a TTL compatible input, that has low static and dynamic power dissipation, that provides a sleep mode and a bus hold function, and that provides high output current.

Static power dissipation in an input portion of the input buffer circuit is reduced by a level shifter that provides an optimum operating voltage to reduce leakage current when a high level TTL signal is applied to the input portion of the input buffer circuit. Utilizing a restore means ensures that proper internal voltage levels are employed to enable the circuit's operation.

Dynamic power dissipation is reduced via sleep mode circuitry which effectively disconnects the input signal from the rest of the input buffer circuit and pulling an output of the buffer circuit to a known logic level.

A bus hold circuit is also provided for holding the logic state appearing at the output of the input buffer circuit when the input signal is removed thereby further reducing static power dissipation. Moreover, the bus hold circuit can be disabled and is compatible with the sleep mode circuitry.

While the invention has been described in specific embodiments, it is evident that many alterations, modifications, and variations will be apparent to those skilled in the art. Further, it is intended to embrace all such alterations, modifications and variations in the appended claims.

We claim:

1. A buffer circuit having an input and an output and having minimum static and dynamic power dissipation, comprising:

shifter means for shifting a first voltage applied at a first voltage supply terminal to an operating voltage that is lower than the first voltage, the shifter means having an input and an output, said input of said shifter means coupled to said first voltage supply terminal;

an input circuit having an input and an output, said output of said input circuit coupled to a pull-up node, said input of said input circuit coupled to the input of the buffer circuit, said output of said shifter means coupled to said input circuit so that said input circuit operates from said operating voltage, said output of said input circuit providing a second voltage at said pull-up node that is less than said operating voltage;

restore means for restoring said second voltage to a voltage that is greater than said operating voltage wherein said restore means couples the pull-up node to said first voltage supply terminal after said second voltage is applied to said pull-up node, said restore means having an input and an output, said input of said restore means coupled to said pull-up node;

output circuit means for providing an output signal at the output of the buffer circuit, said output circuit means being coupled to said output of said restore means and directly connected to said pull-up node and to the input of the buffer circuit; and sleep means for minimizing dynamic power dissipation of the buffer circuit, said sleep means coupled to said input circuit and said pull-up node for disabling a signal appearing at the input of the buffer circuit from said pull-up node, said sleep means also coupled to the output of the buffer circuit for pulling a voltage appearing thereat to a predetermined logic state.

2. A buffer circuit having an input and an output and having minimum static and dynamic power dissipation, comprising:

shifter means for shifting a first voltage applied at a first voltage supply terminal to an operating voltage that is lower than the first voltage, the shifter means having an input and an output, said input of said shifter means coupled to said first voltage supply terminal;

an input circuit having an input and an output, said output of said input circuit coupled to a pull-up node, said input of said input circuit coupled to the input of the buffer circuit, said output of said shifter means coupled to said input circuit so that said input circuit operates from said operating voltage, said output of said input circuit providing a second voltage at said pull-up node that is less than said operating voltage;

restore means for restoring said second voltage to a voltage that is greater than said operating voltage wherein said restore means couples the pull-up node to said first voltage supply terminal after said second voltage is applied to said pull-up node, said restore means having an input and an output, said input of said restore means coupled to said pull-up node;

output circuit means for providing an output signal at the output of the buffer circuit, said output circuit means being coupled to said output of said restore means and directly connected to said pull-up node and to the input of the buffer circuit;

sleep means for minimizing dynamic power dissipation of the buffer circuit, said sleep means coupled to said input circuit and said pull-up node for disabling a signal appearing at the input of the buffer circuit from said pull-up node, said sleep means also coupled to the output of the buffer circuit for pulling a voltage appearing thereat to a predetermined logic state; and hold means for maintaining a logic state appearing at the output of the buffer circuit then said signal appearing at the input of the buffer circuit is removed, said hold means having an input coupled to the output of the buffer circuit, said bus hold means having an output coupled to the input of the buffer circuit.

3. A buffer circuit having an input and an output and having minimum static and dynamic power dissipation, comprising:

shifter means for shifting a first voltage applied at a first voltage supply terminal to an operating voltage that is lower than the first voltage, the shifter means having an input and an output, said input of said shifter means coupled to said first voltage supply terminal;

an input circuit having an input and an output, said output of said input circuit coupled to a pull-up node, said input of said input circuit coupled to the input of the buffer circuit, said output of said shifter means coupled to said input circuit so that said input circuit operates from said operating voltage, said output of said input circuit providing a second voltage at said pull-up node that is less than said operating voltage;

restore means for restoring said second voltage to a voltage that is greater than said operating voltage wherein said restore means couples the pull-up node to said first voltage supply terminal after said second voltage is applied to said pull-up node, said restore means having an input and an output, said input of said restore means coupled to said pull-up node;

output circuit means for providing an output signal at the output of the buffer circuit, said output circuit means being coupled to said pull-up node, said output of said restore means and the input of the buffer circuit; and sleep means for minimizing dynamic power dissipation of the buffer circuit, said sleep means coupled to said input circuit and said pull-up node for disabling a signal appearing at the input of the buffer circuit from said pull-up node, said sleep means also coupled to the output of the buffer circuit for pulling a voltage appearing thereat to a predetermined logic state wherein said sleep means includes;

a transmission gate having first and second terminals and being responsive to first and second control signals, said first terminal of said transmission gate coupled to said input circuit, said second terminal of said transmission gate coupled to said pull-up node;

a first transistor having first and second current carrying electrodes and a control electrode, said first current carrying electrode of said first transistor coupled to said pull-up node, said second current carrying electrode of said first transistor coupled to a second voltage supply terminal, said control electrode of said first transistor coupled to receive the first control signal; and a second transistor having first and second current carrying electrodes and a control electrode, said first current carrying electrode of said second transistor coupled to the output of the buffer circuit, said second current carrying electrode of said second transistor coupled to said second voltage supply terminal, said control electrode of said second transistor coupled to receive said first control signal.

4. The buffer circuit according to claim 1 wherein said input circuit includes:

a first transistor having first and second current carrying electrodes and a control electrode, said control electrode of said first transistor coupled to the input of the buffer circuit, said first current carrying electrode of said first transistor coupled to said pull-up node and said sleep means, said second current carrying electrode of said first transistor coupled to a second voltage supply terminal; and a second transistor having first and second current carrying electrodes and a control electrode, said control electrode of said second transistor coupled to the input of the buffer circuit, said first current carrying electrode of said second transistor coupled to said sleep means, said second current carrying electrode of said second transistor coupled to said shifter means.

5. The buffer circuit according to claim 1 wherein said restore means includes:

a first transistor having first and second current carrying electrodes and a control electrode, said control electrode of said first transistor coupled to said pull-up node, said first current carrying electrode of said first transistor coupled to a second voltage supply terminal, and a second current carrying electrode of said first transistor coupled to said output of said restore means;

a second transistor having first and second current carrying electrodes and a control electrode, said control electrode of said second transistor coupled to said pull-up node, said first current carrying electrode of said second transistor coupled to said output of said restore means, and said second current carrying electrode of said second transistor coupled to said first voltage supply terminal; and a third transistor having first and second current carrying electrodes and a control electrode, said control electrode of said third transistor coupled to the output of said restore means, said first current carrying electrode of said third transistor coupled to said first voltage supply terminal, and said second current carrying electrode of said third transistor coupled to said pull-up node.

6. The circuit according to claim 1 wherein said output circuit means includes:

a first transistor having first and second current carrying electrodes and a control electrode, said control electrode of said first transistor coupled to said output of said restore means, said first current carrying electrode of said first transistor coupled to the output of the buffer circuit, and a second current carrying electrode of said first transistor coupled to said first voltage supply terminal;

a second transistor having first and second current carrying electrodes and a control electrode, said control electrode of said second transistor directly connected to the input of the buffer circuit, said first current carrying electrode of said second transistor coupled to the output of the buffer circuit, and said second current carrying electrode of said second transistor coupled to a second voltage supply terminal; and a third transistor having first and second current carrying electrodes and a control electrode, said control electrode of said third transistor directly connected to said pull-up node, said first current carrying electrode of said third transistor coupled to said first voltage supply terminal, and said second current carrying electrode of said third transistor coupled to the output of the buffer circuit.

7. The buffer circuit according to claim 3 wherein said hold means includes:

an output inverter having an input and an output, said input of said output inverter being coupled to the output of the buffer circuit, said output of the output inverter being coupled to the input of the buffer circuit;

control means responsive to a third control signal and said second control signal for enabling said output inverter.

8. The buffer circuit according to claim 7 wherein said control means includes:

a NAND gate having first and second inputs and an output, said first and second inputs of said NAND gate being respectively coupled to receive said second and third control signals;

an inverter having an input and an output, said input of said inverter being coupled to said NAND gate;

a first transistor having first and second current carrying electrodes and a control electrode, said first current carrying electrode of said first transistor coupled to said output inverter, said second current carrying electrode of said first transistor coupled to said first voltage supply terminal, said control electrode of said first transistor coupled to said output of said NAND gate; and a second transistor having first and second current carrying electrodes and a control electrode, said first current carrying electrode of said second transistor coupled to said output inverter, said second current carrying electrode of said second transistor coupled to a second voltage supply terminal, said control electrode of said second transistor coupled to said output of said inverter.

9. A buffer circuit having an input and an output and having minimum static and dynamic power dissipation, comprising:

an input circuit having an input and an output, said input of said input circuit coupled to the input of the buffer circuit;

output circuit means for providing an output signal at the output of the buffer circuit, said output circuit means having an input being coupled to said output of said input circuit and to the input of the buffer circuit; and sleep means for minimizing dynamic power dissipation of the buffer circuit, said sleep means coupled to said input circuit and to said output of said input circuit for disabling a signal appearing at the input of the buffer circuit from said output of said input circuit, said sleep means also coupled to the output of the buffer circuit for pulling a voltage appearing thereat to a predetermined logic state said sleep means including:

a transmission gate having first and second terminals and being responsive to first and second control signals, said first terminal of said transmission gate coupled to said input circuit, said second terminal of said transmission gate coupled to said output of said input circuit;

a first transistor having first and second current carrying electrodes and a control electrode, said first current carrying electrode of said first transistor coupled to said output of said input circuit, said second current carrying electrode of said first transistor coupled to a second voltage supply terminal, said control electrode of said first transistor coupled to receive a first control signal; and a second transistor having first and second current carrying electrodes and a control electrode, said first current carrying electrode of said second transistor coupled to the output of the buffer circuit, said second current carrying electrode of said second transistor coupled to said second voltage supply terminal, said control electrode of said second transistor coupled to receive said first control signal.

10. The buffer circuit according to claim 2 wherein said input circuit includes:

a first transistor having first and second current carrying electrodes and a control electrode, said control electrode of said first transistor coupled to the input of the buffer circuit, said first current carrying electrode of said first transistor coupled to said pull-up node and said output circuit means, said second current carrying electrode of said first transistor coupled to a second voltage supply terminal; and a second transistor having first and second current carrying electrodes and a control electrode, said control electrode of said second transistor coupled to the input of the buffer circuit, said first current carrying electrode of said second transistor coupled to said sleep means, said second current carrying electrode of said second transistor coupled to said shifter means.

11. The buffer circuit according to claim 2 wherein said restore means includes:

a first transistor having first and second current carrying electrodes and a control electrode, said control electrode of said first transistor coupled to said pull-up node, said first current carrying electrode of said first transistor coupled to a second voltage supply terminal, and a second current carrying electrode of said first transistor coupled to said output of said restore means;

a second transistor having first and second current carrying electrodes and a control electrode, said control electrode of said second transistor coupled to said pull-up node, said first current carrying electrode of said second transistor coupled to said output of said restore means, and said second current carrying electrode of said second transistor coupled to said first voltage supply terminal; and a third transistor having first and second current carrying electrodes and a control electrode, said control electrode of said third transistor coupled to the output of said restore means, said first current carrying electrode of said third transistor coupled to said first voltage supply terminal, and said second current carrying electrode of said third transistor coupled to said pull-up node.

* * * * *